United States Patent [19]

Mandelman

[11] Patent Number: 5,614,433
[45] Date of Patent: Mar. 25, 1997

[54] METHOD OF FABRICATING LOW LEAKAGE SOI INTEGRATED CIRCUITS

[75] Inventor: Jack A. Mandelman, Stormville, N.Y.

[73] Assignee: International Business Machines Corporation, Armonk, N.Y.

[21] Appl. No.: 573,859

[22] Filed: Dec. 18, 1995

[51] Int. Cl.[6] ................................................. H01L 21/70
[52] U.S. Cl. ..................... 437/57; 437/34; 437/45; 437/56; 437/58; 437/143; 148/DIG. 77; 148/DIG. 150
[58] Field of Search ................................. 437/34, 45, 56, 437/57, 58, 143; 148/DIG. 77, DIG. 150

[56] References Cited

U.S. PATENT DOCUMENTS

| | | | |
|---|---|---|---|
| 3,933,530 | 1/1976 | Mueller et al. | 148/1.5 |
| 3,958,266 | 5/1976 | Athanas | 148/DIG. 150 |
| 4,507,846 | 4/1985 | Ohno | 437/57 |
| 4,753,895 | 6/1988 | Mayer et al. | 437/34 |
| 4,871,690 | 10/1989 | Holonyak, Jr. et al. | 437/105 |
| 4,910,160 | 3/1990 | Jennings et al. | 437/31 |
| 4,946,799 | 8/1990 | Blake et al. | 148/DIG. 150 |
| 5,024,965 | 6/1991 | Chang et al. | 148/DIG. 150 |
| 5,047,356 | 9/1991 | Li et al. | 437/34 |
| 5,053,353 | 10/1991 | Black | 148/DIG. 150 |
| 5,231,045 | 7/1993 | Miura et al. | 437/62 |
| 5,426,062 | 6/1995 | Hwang | 148/DIG. 150 |

FOREIGN PATENT DOCUMENTS 01-186612 7/1989 Japan.

OTHER PUBLICATIONS

H. P. Zappe, et al., J. Electrochem. Soc., "Effective Charge Modification Between SiO2 and Silicon", vol. 136, No. 8, Aug. 1989, pp. 2368–2370.
T. Miura, et al., 1988 VLSI Symposium, "Trench–Isolation Technology Using Al Ion Implantation in a SiO2 Layer", pp. 19–20.

*Primary Examiner*—John Niebling
*Assistant Examiner*—Long Pham

[57] ABSTRACT

An SOI integrated circuit contains Al implanted below the channel areas of NFETs and has a positive substrate bias, the magnitude of the substrate bias and the implant dose being set such that the bias suppresses backside leakage in the PFETs and the implant dose suppresses leakage in the NFEts in spite of the bias.

5 Claims, 2 Drawing Sheets

ID OF THE INVENTION

The field of the invention is that of fabricating integrated circuits on silicon using Silicon-On-Insulator (SOI) wafers.

BACKGROUND ART

In SOI MOSFETs, electrical leakage between source and drain diffusions can occur in the SOI silicon layer at the interface with the back oxide layer. This leakage results from weak inversion at the back interface due to charge at the interface or in the back oxide. This charge may result from contamination introduced during processing, from trap generation at the interface or in the bulk of the back oxide during processing, from the operating environment (i.e. ionizing radiation), or due to the electrical operating conditions (giving rise to impact ionization).

In the past, with relatively thick SOI layers (>200 nm) it was possible to tailor the vertical doping profile in the SOI MOSFET channels such that the doping concentration at the backside is greater than at the frontside of the SOI layer. An ion implantation having a peak near the back interface between the device layer and the insulating layer is used to achieve the desired doping profile (boron for the NFETs, phosphorus or arsenic for PFETs). This produced the effect of increasing the backside threshold voltage without increasing the frontside threshold voltage $V_t$. Thus, it was possible to suppress backside leakage without seriously affecting the performance of the device.

With the thin SOI layers employed today (<100 nm) attempts to increase the doping at the backside of the SOI significantly increase the doping at the frontside. This degrades the characteristics of the MOSFETs.

U.S. Pat. No. 5,231,045 illustrates a method of forming NMOS SOI integrated circuits, including the step of implanting aluminum ions into a substrate wafer prior to a bonding step in which two wafers are bonded together to form the SOI wafer. This method produces a uniform dopant concentration of Al across the entire wafer. If applied to CMOS processing, this method would leave implanted charge underneath both the NFETs and the PFETs. Although backside leakage in the NFETs is suppressed, this approach would have the unfortunate effect that the magnitude of the threshold for the PFETs will be lowered by the implanted ions and the PFET leakage current would be increased. This prior art work teaches away from implantation of Al through the device layer because of damage to the crystal structure of the device layer.

SUMMARY OF THE INVENTION

The invention relates to a method of forming SOI integrated circuits in which a laterally non-uniform distribution of Al ions is implanted under the channels of the NFET transistors, thereby suppressing leakage current through the NFET transistors when the transistors are off. The dose is selected such that the threshold of the backside NFET is sufficiently high that leakage through the NFETs is a negligible amount even when a positive bias is applied to the substrate sufficient to suppress leakage in the PFET transistors. The simultaneous use of implanted aluminum (trapping negative charge) under the NFETs and positive substrate bias to control PFET off-current provides additional design flexibility that allows lower channel doping in both transistor types. As an example, application of the invention to a non-fully depleted SOI MOSFET having a backside contaminating positive effective charge concentration ($Q_{eff}$) of $5 \times 10^{11}/cm^2$, a back oxide thickness of 200 nm and a top oxide (gate oxide) thickness of 10 nm would allow a top surface $V_t$ that is nearly 250 mV lower than what would result if doping alone were used to suppress backside leakage. An analogous situation exists for the PFET. The degree of benefit in reduced top surface $V_t$ depends, as is known in the art, on the magnitude of the contaminating backside charge and the ratio of the top oxide and back oxide thicknesses.

The reduced channel doping produces lower front side $V_t$ and higher carrier mobility and, hence, higher performance.

BEST MODE OF CARRYING OUT THE INVENTION

Figure 1:
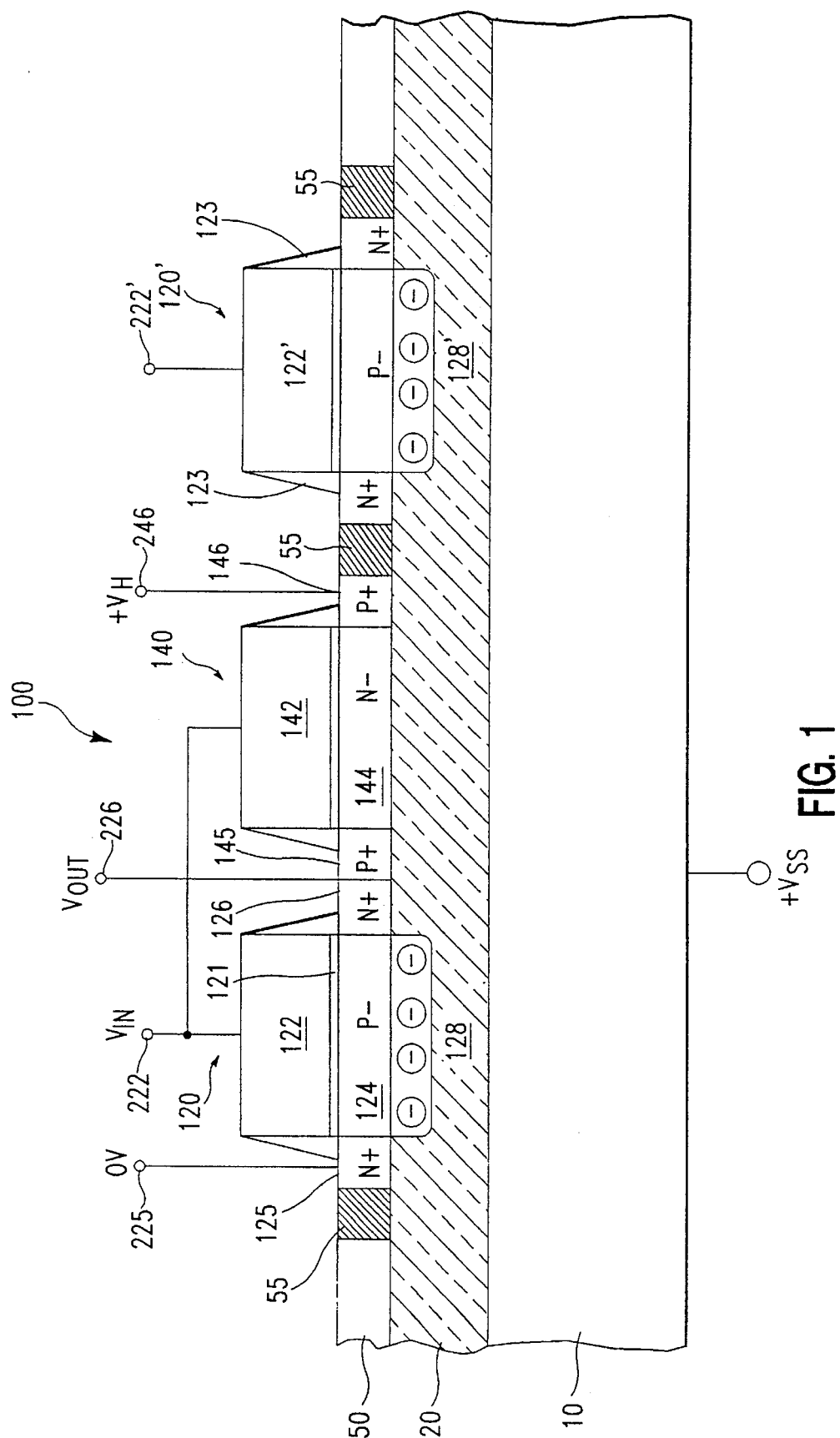
FIG. 1 illustrates in partially pictorial, partially schematic form a portion of an integrated circuit constructed according to the invention.

Referring now to FIG. 1, there is shown a portion of an SOI integrated circuit, formed in silicon device layer 50 disposed above insulator layer 20 and supporting substrate 10, and containing a pair of transistors, denoted generally with the numeral 100, which form an inverter. On the left of the figure, NFET 120 has source 125 and drain 126 separated by gate 122 located above P⁻ channel region 124. To the right of transistor 120, PFET transistor 140 contains a corresponding gate 142 above a corresponding N⁻ body 144. Together these two transistors are connected to form an inverter, a conventional circuit well known to those skilled in the art having input terminal 222 and output terminal 226 and bias terminals 225 for a ground connection and 246 for the positive power supply connection. Inverter 100 is isolated from other portions of the circuit by trench isolation 55, formed by etching a trench though device layer 50 and filling it with oxide or any other convenient insulator. On the right of the figure, the remainder of the circuit is represented schematically by NFET 120' having terminal 222' representing the interconnection members.

At the bottom of the figure, lower substrate 10 is a conventional relatively thick (740 μm) substrate for a 200 mm diameter wafer that supports device layer 50, which contains the sources, drains and channels of the transistors. Separating substrate 10 and device layer 50 is insulator 20, conventionally a $SiO_2$ layer. Layer 20 may be formed by bonding two wafers and grinding the upper one down to form the desired thickness of layer 50, or by the SIMOX process in which oxygen is implanted into a single wafer.

The conventional preliminary steps of forming the wafer, performing a blanket threshold dose across the wafer, and the like will be referred to generically as preparing the substrate. These conventional steps are omitted for simplicity in description.

At a convenient step in the processing sequence, before the gates are formed, a backside implant dose of Al is implanted through device layer 50 into insulator 20 below at least the areas that will carry the channels of the NFET transistors. As will be discussed below, this backside implant avoids the area beneath the PFET channels.

Figure 2:
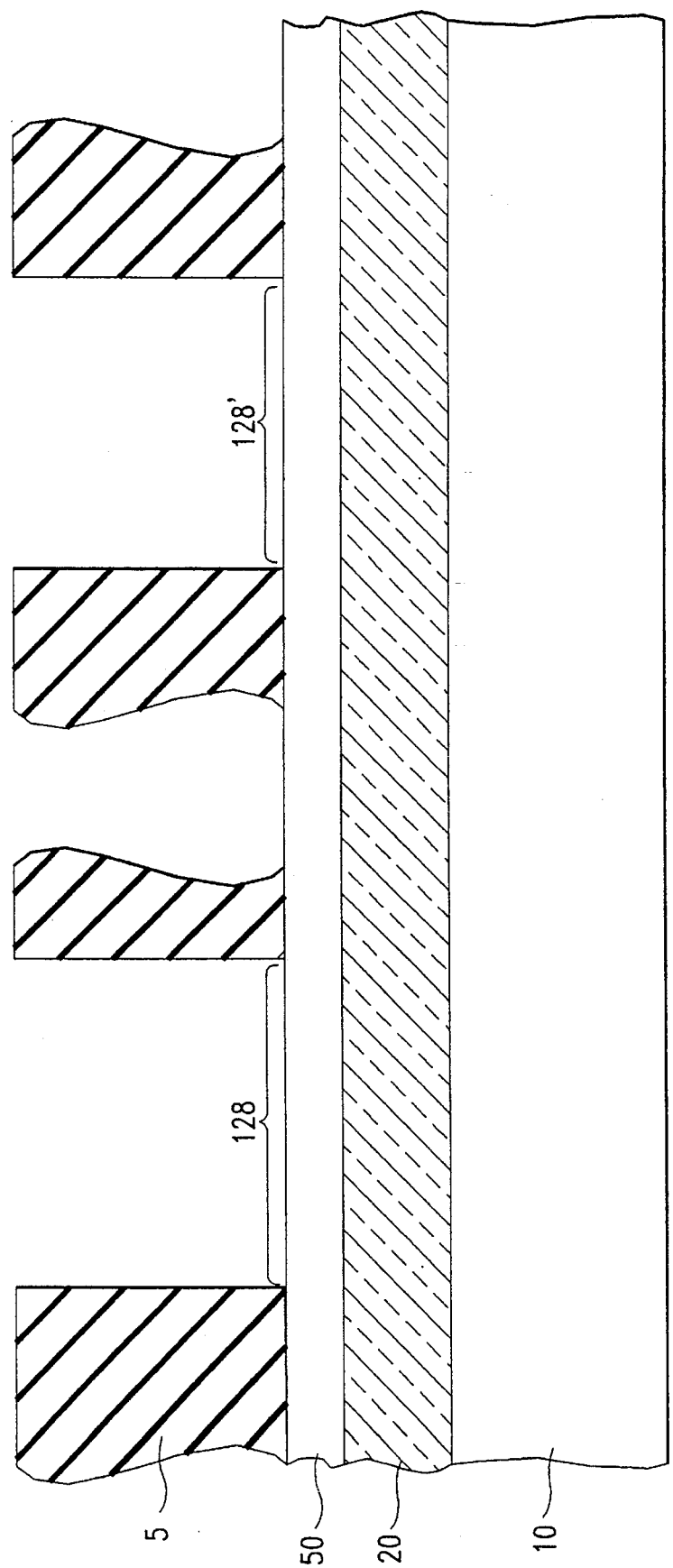
FIG. 2 illustrates in schematic form a portion of the circuit in FIG. 1 at an intermediate processing step.

Referring now to FIG. 2, the same portion of the integrated circuit shown in FIG. 1 is illustrated, in which substrate 10 and insulator 20 are as before, and a photoresist 5 has been deposited and patterned to open up the sites for the NFET transistors. These sites are denoted with the brackets labeled 128 and 128' for the two NFET transistors to the left and the right of the drawing. The implant voltage of the Al is illustratively in the range of 65–200 KeV which is suitable for a device layer 50 having a thickness of between 100 and 200 nm. With this thickness and this energy, the peak of the ion distribution is located below the lower surface of layer 50 (referred to as the backside surface).

There will be a tail on the ion distribution, of course, that extends into the channel region of the NFET, but it is been found that even though the Al is in Column III of the periodic table, the Al is effectively electrically neutral and does not adversely affect the operation of the transistors. In the event that some application requires very careful control of transistor threshold voltage, those skilled in the art will readily be able to adjust the threshold implant to account for the minor influence of the backside tail. This lack of influence is the case, even though the Al is subject to high-temperature steps such as thermal oxidation and annealing. It has further been found that Al diffuses through the oxide very slowly, so that subsequent high temperature processing does not cause the Al to diffuse over underneath adjacent PFETs. The Al diffusivity in the SOI device layer is high, about 10 times that of boron, but diffusion in the silicon does not matter because the Al is effectively electrically neutral. These Al dopant concentrations, denoted by the dotted lines labeled 128 and 128' in FIG. 1, serve to compensate for charge that may be deposited or formed on the backside surface during processing, or may result from cosmic or other radiation, or resulting from hot carrier damage during device operation.

A well known problem in SOI fabrication is that two transistors are formed in parallel. The conventional transistor extending from source 125 to drain 126, and controlled by gate 122, has a parasitic counterpart using the same source and drain, but a channel that may be formed at the backside surface of device layer 50. This parasitic transistor will usually not be critical to the operation of the device, but it does affect the leakage of the current through the transistor when it should be off. Those skilled in the art will appreciate that tying the substrate 10 to ground serves reasonably well to control leakage through backside parasitic NFET transistors, depending on the dopant concentration of layer 50, but serves to increase the leakage current through the PFET transistor 140.

An aspect of the invention is that substrate 10 is biased with a backside bias voltage to $+V_{ss}$, which may be illustratively the voltage of the power supply or any other convenient positive voltage. Thus, in operation, the backside parasitic PFET transistors are turned off by the application of the positive voltage at the substrate. This would ordinarily turn on, or start to turn on, the NFET transistors, but the dose of the Al implant is selected such that when the field is applied to substrate 10, the concentration of Al ions serves effectively to maintain the threshold of the parasitic transistor at a value sufficiently high that leakage current is negligible. In the illustrative embodiment, a dose of $1\times10^{14}/cm^2$ produces a shift in the threshold of the backside parasitic NFET of $\geq 3$ V to a backside reference threshold of >8.0 V. for a backside oxide layer (20) thickness of 200 nm.

As an example of another operating condition, if a substrate voltage ($V_{ss}$) of +1.5 V is required to control backside leakage in the PFETs and the positive backside interface effective charge is $4.5\times10^{11}/cm^2$, an aluminum dose implanted into the back oxide of typically $5\times10^{14}/cm^2$ is required to reduce NFET backside leakage to an acceptable level. The fact that increasing the implant dose by a factor of 5 only doubles the amount of backside $V_t$ shift is based on data from "Trench Isolation Using Al Ion Implantation is a $SiO_2$ Layer", Miura, et al, 1988 VLSI Symposium, p. 19.

The shift in backside NFET threshold voltage is less than what would be expected to result from the application of a negative charge density of $1\times10^{14}/cm^2$ all at the back interface. This results since the implanted aluminum is distributed throughout the back oxide (instead of being solely at the back interface with the silicon device layer) and the fact that only a fraction of the aluminum is electrically active. Thus, if the chip is operated with a substrate bias ($V_{ss}$) of 0.0 volts an implanted aluminum dose of $1\times10^{14}$ may compensate for the effect that a backside interfacial charge density of $\approx 3\times10^{11}/cm^2$ has on the NFETs. If it is desired to operate the substrate at a positive voltage ($V_{ss}>0$) to reduce backside leakage in the PFETs, the aluminum dose may be increased appropriately to meet the off-current objective of the NFETs.

Other p-type species (e.g. Sr, Ca) may be used in place of Al.

Those skilled in the art will readily appreciate that different embodiments of the invention may be made in view of the enclosed teaching and the following claims are not meant to be limited to the embodiments disclosed.

I claim:

1. A method of forming an SOI CMOS integrated circuit containing NFETs and PFETs comprising the steps of:

preparing an SOI wafer having a lower substrate, a device layer for containing NFETs and PFETs and an insulating layer separating said device layer and said lower substrate;

defining a plurality of NFET regions for the formation of said NFETs and containing NFET channel areas by patterning a blocking layer having a thickness;

implanting said plurality of NFET regions with a backside implant that is blocked by said blocking layer, whereby said NFET regions are implanted and locations of PFETs in said wafer are not implanted, said backside implant having a backside implant energy such that said backside implant penetrates through said device layer in said NFET channel areas and into said insulating layer, said backside implant further having a backside dose such that a plurality of backside parasitic NFET transistors have a backside threshold greater than a backside reference threshold when a backside positive bias voltage for suppressing backside leakage in said PFETs is applied to said lower substrate;

forming said NFETs and PFETs in said device layer; and completing said integrated circuit.

2. A method according to claim 1, in which said backside implant contains a species that provides negative fixed charge at said backside interface and is substantially electrically inactive in said device layer.

3. A method according to claim 2, in which said backside implant contains a species selected from the third column of the periodic table.

4. A method according to claim 2, in which said backside implant contains a species selected from the second column of the periodic table.

5. A method according to claim 2, in which said backside implant contains a species selected from the group comprising aluminum, calcium, and strontium.

* * * * *